United States Patent
Noble et al.

(10) Patent No.: US 6,235,569 B1
(45) Date of Patent: May 22, 2001

(54) CIRCUIT AND METHOD FOR LOW VOLTAGE, VOLTAGE SENSE AMPLIFIER

(75) Inventors: Wendell P. Noble, Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/451,982

(22) Filed: Nov. 30, 1999

Related U.S. Application Data

(62) Division of application No. 09/050,615, filed on Mar. 30, 1998.

(51) Int. Cl.[7] ............................. H01L 21/8299

(52) U.S. Cl. .................. 438/234; 438/199; 438/149; 438/587

(58) Field of Search ................. 438/234, 587, 438/199, 149

(56) References Cited

U.S. PATENT DOCUMENTS

| | | | |
|---|---|---|---|
| 4,450,048 | 5/1984 | Gaulier | 204/15 |
| 4,521,448 | 6/1985 | Sasaki | 427/88 |
| 4,673,962 | 6/1987 | Chatterjee et al. | 357/23.6 |
| 4,922,315 | 5/1990 | Vu | 357/35 |
| 4,987,089 | 1/1991 | Roberts | 437/34 |
| 4,996,574 | 2/1991 | Shirasaki | 357/23.7 |
| 5,006,909 | 4/1991 | Kosa | 357/23.6 |
| 5,023,688 | 6/1991 | Ando et al. | 357/42 |
| 5,097,381 | 3/1992 | Vo et al. | 361/313 |
| 5,122,848 | 6/1992 | Lee et al. | 357/23.6 |
| 5,250,450 | 10/1993 | Lee et al. | 437/40 |

(List continued on next page.)

FOREIGN PATENT DOCUMENTS

| | | | |
|---|---|---|---|
| 431855B1 | 11/1990 | (EP) | H01L/29/772 |
| 0431855 | 6/1991 | (EP) | H01L/29/772 |

OTHER PUBLICATIONS

Blalock, T.N., et al., "A High–speed Sensing Scheme for 1T Dynamic RAMs Utilizing the Clamped Bit–line Sense Amplifier", *IEEE Journal of Solid–State Circuits*, 27(4), 618–625, (Apr., 1992).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, Sep. 30–Oct. 3, 1996.

(List continued on next page.)

*Primary Examiner*—John F. Niebling
*Assistant Examiner*—Christopher Lattin
(74) *Attorney, Agent, or Firm*—Schwegman, Lundberg, Woessner & Kluth, P.A.

(57) ABSTRACT

An improved circuit and method for gate-body transistors is provided. The improved circuit and method can accord a faster switching speed and low power consumption. The present invention capitalizes on opposing sidewalls and adjacent conductive sidewall members to conserve available surface space on the semiconductor chips. The gate and body of the transistors are biased to modify the threshold voltage of the transistor ($V_t$). Additionally, the conductive sidewall members and a gate are biased from a single source. The structure offers performance advantages from both metal-oxide semiconductor (MOS) and bipolar junction transistor (BJT) designs. The device can be used in a variety of applications, digital and analog, wherever a more compact structure with low power consumption and fast response time is needed.

22 Claims, 14 Drawing Sheets

U.S. PATENT DOCUMENTS

| | | | |
|---|---|---|---|
| 5,315,143 | 5/1994 | Tsuji | 257/351 |
| 5,350,934 | 9/1994 | Matsuda | 257/139 |
| 5,379,255 | 1/1995 | Shah | 365/185 |
| 5,453,636 | 9/1995 | Eitan et al. | 257/378 |
| 5,491,356 | 2/1996 | Dennison et al. | 257/306 |
| 5,508,544 | 4/1996 | Shah | 257/316 |
| 5,528,062 | 6/1996 | Hsieh et al. | 257/298 |
| 5,541,432 | 7/1996 | Tsuji | 257/350 |
| 5,554,870 | 9/1996 | Fitch et al. | 257/334 |
| 5,581,104 | 12/1996 | Lowrey et al. | |
| 5,585,998 | 12/1996 | Kotecki et al. | 361/321.4 |
| 5,587,665 | 12/1996 | Jiang | 326/16 |
| 5,646,900 | 7/1997 | Tsukude et al. | 365/205 |
| 5,680,345 | 10/1997 | Hsu et al. | 365/185.01 |
| 5,689,121 | 11/1997 | Kitagawa et al. | 257/139 |
| 5,691,230 | 11/1997 | Forbes | 437/62 |
| 5,714,413 | 2/1998 | Brigham et al. | 438/301 |
| 5,796,143 | 8/1998 | Fulford, Jr. et al. | 257/330 |
| 5,796,166 | 8/1998 | Agnello et al. | 257/751 |
| 5,844,273 | 12/1998 | Konishi | 257/331 |
| 5,892,260 | 4/1999 | Okumura et al. | 257/347 |
| 5,907,170 | 5/1999 | Forbes et al. | 257/296 |
| 5,909,618 | 6/1999 | Forbes et al. | 438/242 |
| 5,914,511 | 6/1999 | Noble et al. | 257/302 |
| 5,936,274 | 8/1999 | Forbes et al. | 257/315 |
| 5,973,356 | 10/1999 | Noble et al. | 257/319 |
| 6,025,225 | 2/2000 | Forbes et al. | 438/243 |
| 6,091,654 | * 7/2000 | Forbes et al. | 365/208 |

OTHER PUBLICATIONS

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17 (11), 509–511, (Nov. 1996).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horiguchi, et al., "Switched–Source–Impedance CMOS Circuit for Low Standby Subthreshold Current Giga–Scale LSIs", *IEEE Journal of Solid State Circuits*, vol. 28, 1131–1135, (1993).

Huang, W.L., et al., "TFSOI Complementary BiCMOS Technology for Low Power Applications", *IEEE Transactions on Electron Devices*, 42, 506–512, (Mar. 1995).

Ko, et al., "High–gain Lateral Bipolar Action in a MOSFET Structure", *IEEE Trans. on Electron Devices*, vol. 38, No. 11, 2487–96, (Nov. 1991).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Parke, S.A., et al., "A High–Performance Lateral Bipolar Transistor Fabricated on SIMOX", *IEEE Electron Device Letters*, 14, 33–35, (Jan. 1993).

Rabaey, *Digital Integrated Circuits*, Prentice Hall, Englewood Cliffs, NJ, 222–232, (1996).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits*, 26(4), pp. 525–535, (Apr. 1991).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Tsui, P.G., et al., "a Versatile Half–Micron Complementary BiCMOS Technology for Microprocessor–Based Smart Power Applications", *IEEE Transactions on Electron Devices*, 42, 564–570, (Mar. 1995).

Tuinega, *A Guide to Circuit Simulation and Analysis Using PSPICE*, Prentice Hall, Englewood Cliffs, NJ, (1988).

Wong, et al., "a 1V CMOS Digital Circuits with Double–Gate Driven MOSFET", *IEEE Int. Solid State Circuits Conference*, San Francisco, 292–93, (1997).

Wolf, S., *In: Silicon Processing for the VLSI Era, vol. 2: Process Integration*, Lattice Press, Sunset Beach, CA, 389–392, (1990).

Yilmaz, H., et al., "Recent Advances in Insulated Gate Bipolar Transistor Technology", *IEEE Transactions on Industry Applications*, 26(5), pp. 831–834, (Sep. 1990).

* cited by examiner

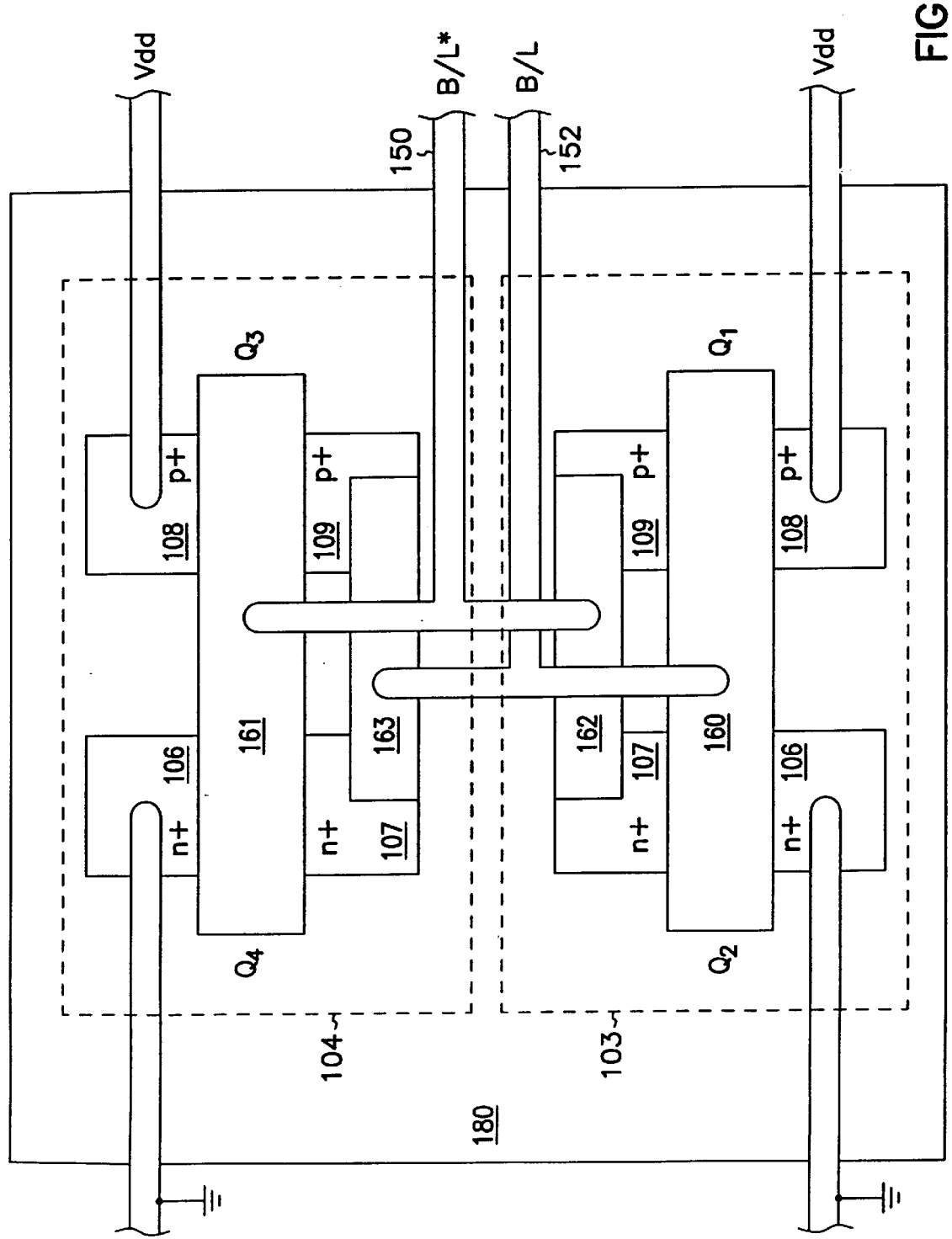

CIRCUIT AND METHOD FOR LOW VOLTAGE, VOLTAGE SENSE AMPLIFIER

RELATED APPLICATIONS

This application is a Divisional of U.S. Ser. No. 09/050,615, filed Mar. 30, 1998.

This application is related to the following co-filed and commonly assigned applications, U.S. Ser. No. 09/050,443, filed Mar. 30, 1998, entitled "Circuit and Method for Low Voltage, Current Sense Amplifier," U.S. Ser. No. 09/050,266, filed Mar. 30, 1998, entitled "Structure and Method for Gated Lateral Bipolar Transistors," and U.S. Ser. No. 09/050,579, filed Mar. 30, 1998, entitled "Circuit and Method for Gate-Body Structures in CMOS Technology," which are hereby incorporated by reference.

FIELD OF THE INVENTION

The present invention relates generally to semiconductor integrated circuits. More particularly, it pertains to the circuit and method for a low voltage, voltage sense amplifier.

BACKGROUND OF THE INVENTION

Integrated circuit technology relies on transistors to formulate vast arrays of functional circuits. The complexity of these circuits require the use of an ever increasing number of linked transistors. As the number of transistors required increases, the surface space on silicon chip/die dwindles. It is desirable then, to construct transistors which occupy less surface area on the silicon chip/die.

Metal-oxide semiconductor field effect transistors (MOS transistors) are prevalent in integrated circuit technology because they generally demand less power than their counterpart, bipolar transistors. Bipolar transistors, on the other hand, also possess certain advantages over MOS transistors, such as speed. Therefore, attempts have been made to combine the technological designs of bipolars and MOS transistors in an effort to maximize the benefits of both transistor types.

Various types of lateral transistors have been historically described and utilized in complementary metal-oxide semiconductor (CMOS) technology. Lateral bipolar transistors have received renewed interest with the advent of bipolar complementary metal-oxide semiconductor (BiCMOS) technologies. Recently the action of newer devices has been described in new terms and a more careful distinction made between the different types of transistor action possible. Both gate-body connected MOS transistors and gated lateral bipolar transistors have been described. The term gate-body connected transistors is used to describe vertical or other device structures where the body of the MOS transistor also serves as the base of a bipolar transistor but each device functions separately as a normal transistor and MOS transistor action is dominant. Applying the gate voltage to the body serves primarily to change the threshold voltage of the MOS transistor.

Other structures are possible where the gate and base are common and the bipolar transistor and MOS transistor are in parallel but the bipolar transistor current is dominant. In a gated lateral transistor, not only the structures but also the operation is merged and most current flows along the surface under the gate in either MOS or bipolar operation. In the case of a gated lateral bipolar transistor, at low gate voltages around threshold ($V_t$) they can act as gate-body connected MOS transistors. At higher input voltages, $V_t$ or more, the bipolar action can dominate and they are more appropriately described as gated lateral bipolar transistors.

Much effort has been placed into the study of these merged transistor structures. Both vertical and lateral structures have been studied. These studies do not look to solutions for conserving precious die space in the fabrication of integrated circuits. Likewise, previous efforts have not been able to maximize low power operation and simultaneously maximize switching speeds. It is desirable then to invent structures, circuits and methods which can accommodate the faster switching speed and low power consumption. Improved configuration of transistor structure should desirably remain fully integrateable with prevalent integrated circuit design.

SUMMARY OF THE INVENTION

The above mentioned problems with memory devices and other problems are addressed by the present invention and will be understood by reading and studying the following specification. A circuit and method is provided which can accord a faster switching speed and low power consumption.

In particular, an illustrative embodiment of the present invention includes a voltage sense amplifier. The voltage sense amplifier circuit includes a pair of cross coupled inverters, wherein each inverter comprises a complementary pair of gate-body transistors. The complementary pair comprises a first channel type transistor and a second channel type transistor. Each gate-body transistor has a body region formed of single crystalline semiconductor material which extends outwardly from a substrate. The body region has an upper surface and opposing sidewalls. A source/emitter region and a collector/drain region is formed within a portion of the upper surface of the body region. A gate is formed above the upper surface of the body region. Conductive sidewall members are disposed adjacent to the opposing sidewalls of the body region. A pair of bit lines are included, each bit line couples to the gates of one of the complementary pair of transistors and to the collector drain regions of the other complementary pair of transistors.

In another embodiment, a method of fabricating a voltage sense amplifier is provided. The method includes forming a pair of cross coupled inverters where each inverter includes a complementary pair of gate-body transistors. The complementary pair includes a first channel type transistor and a second channel type transistor. Forming each gate-body transistor includes forming a body region of single crystalline semiconductor material that extends outwardly from a substrate. The body region has an upper surface and opposing sidewalls. A source/emitter region and a collector drain region are formed within a portion of the upper surface of the body region. A gate is formed above the upper surface of the body region. Conductive sidewall members are formed adjacent to the opposing sidewalls of the body region. A pair of bit lines are formed such that each bit line couples to the gates of one of the complementary pair of transistors and to the collector/drain regions of the other complementary pair of transistors.

In another embodiment, an information handling system is provided. The information handling system includes a central processing unit, a random access memory, and a system bus for communicatively coupling the central processing unit and the random access memory. The information handling system further includes a voltage sense amplifier. The voltage sense amplifier includes the embodiment presented above.

Thus, an improved low voltage, voltage sense amplifier circuit and method for fabricating the same is provided.

Embodiments of the present invention capitalize on opposing sidewall structures and adjacent conductive sidewall members to conserve available surface space on the semiconductor chips. Conservation of surface space achieves a higher density of surface structures per chip. The voltage sense amplifier is designed to operate with power supply voltages as low as 0.5 volts and to provide faster switching capability.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrmentalities, procedures, and combinations particularly pointed out in the appended claims.

BRIEF DESCRIPTION OF THE DRAWINGS

FIG. 1B is a top view of the voltage sense amplifier shown in FIG. 1.

FIGS. 2A–2J illustrate an embodiment of a process of fabrication of a voltage sense amplifier.

DETAILED DESCRIPTION

Figure 1A:
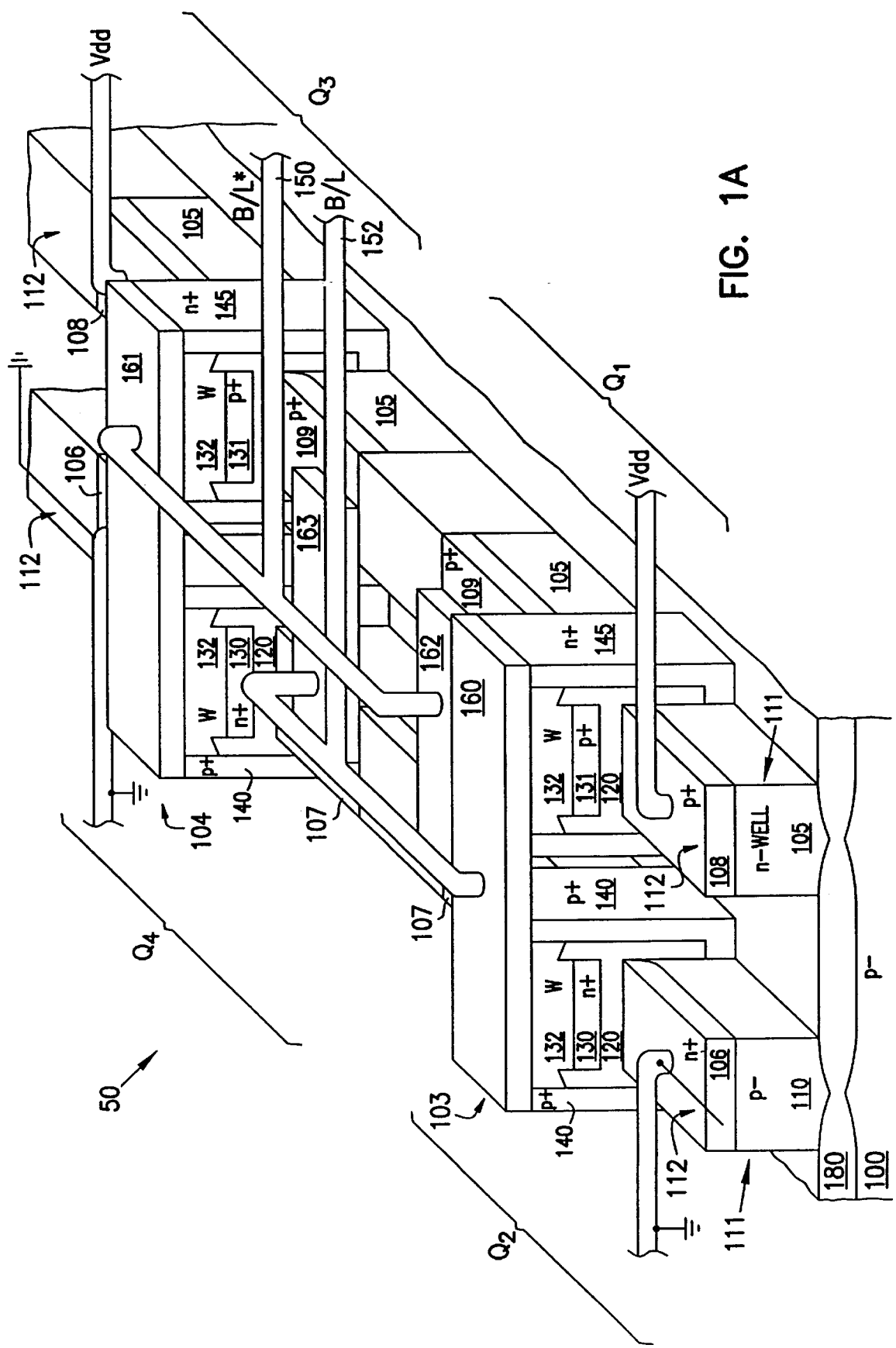
FIG. 1A is a perspective view illustrating a voltage sense amplifier according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

FIG. 1A is a perspective view illustrating generally an embodiment of a portion of a voltage sense amplifier according to the teachings of the present invention. Specifically, voltage sense amplifier 50 is a four transistor device that is formed using, for example, the technique described below with respect to FIGS. 2A through 2J. Each transistor in voltage sense amplifier 50 is either an n-channel metal-oxide semiconductor (NMOS) or a p-channel metal-oxide semiconductor (PMOS). The voltage sense amplifier 50 includes two NMOS transistors, $Q_2$ and $Q_4$ respectively. Also, the voltage sense amplifier 50 includes two PMOS transistors, $Q_1$ and $Q_3$ respectively. Each NMOS and PMOS transistor includes a body region, 110 and 105 respectively, formed of single crystalline semiconductor material that extends outwardly from a substrate. The body regions 110 and 105 have an upper surface 112 and opposing sidewalls 111. In one embodiment, the NMOS body region 110 is formed from a p– silicon material and the PMOS body region 105 is formed from n– silicon material.

The substrate 100 is p– silicon material. In an exemplary embodiment, the NMOS and PMOS body regions, 110 and 105 respectively, are formed on an insulator layer 180 formed on the substrate 100. Both of the NMOS and PMOS transistors include source/emitter regions, 106 and 108 respectively, formed within the upper surface 112 of the body regions, 110 and 105 respectively. Likewise, each of the NMOS and PMOS transistors include a collector/drain region, 107 and 109 respectively, formed within the upper surface 112 of the body regions, 110 and 105 respectively.

A dielectric layer 120 is formed on the upper surface 112 and on portions of the opposing sidewalls 111 for both the NMOS and PMOS transistors. The NMOS transistors, $Q_2$ and $Q_4$, include a gate 130 on the dielectric layer 120. The PMOS transistors, $Q_1$ and $Q_3$, include a gate 131 formed on the dielectric layer 120. In one embodiment, gate 131 is formed of p+ silicon material and gate 130 is formed of n+ silicon material. The NMOS transistors, $Q_2$ and $Q_4$, include conductive sidewall members 140. The PMOS transistors, $Q_1$ and $Q_3$, similarly include conductive sidewall members 145. In one embodiment, the conductive sidewall members 140 are formed of p+ silicon material and the conductive sidewall members 145 are formed of n+ silicon material. Conductive sidewall members, 140 and 145 respectively, are disposed adjacent to portions of the dielectric layer 120 formed on the opposing sidewall surfaces 111. In one embodiment, the conductive sidewall members, 140 and 145 respectively, couple to the gates, 130 and 131 respectively, of the NMOS and PMOS transistors. The conductive sidewall members, 140 and 145 respectively, further couple to a portion of the opposing sidewalls 111 of the NMOS and PMOS transistors such that the transistors give metal-oxide semiconductor (MOS) type conduction and bipolar junction transistor (BJT) type conduction underneath the gates, 130 and 131 respectively. In one embodiment, the conductive sidewall members, 140 and 145 respectively, are formed of polysilicon.

Voltage sense amplifier 50 also includes cross-coupled inverters 104 and 103. Inverter 103 comprises the combination of transistor $Q_1$ and $Q_2$. The gates of transistors $Q_1$ and $Q_2$ are coupled together by gate contact 160. Gate contact 160 couples to gate 130 of transistor $Q_2$ through a refractory metal 132. Gate contact 160 couples to gate 131 of transistor $Q_1$ through a refractory metal 132. Similarly, inverter 104 includes transistors $Q_3$ and $Q_4$. The gates of transistors $Q_3$ and $Q_4$ are coupled together by gate contact 161. Gate contact 161 couples to gate 130 of transistor $Q_4$ through a refractory metal 132. Likewise, gate contact 161 couples to gate 131 of transistor $Q_3$ through a refractory metal 132. The collector/drain regions, 107 and 109 respectively, of inverter 103 are coupled together by a metal shunt 162. Likewise, the collector/drain regions, 107 and 109 respectively, of inverter 104 are coupled together by a shunt 163. Metal shunt 163 is cross-coupled to gate contact 160. Metal shunt 162 is cross-coupled to gate contact 161. A pair of bit lines, B/L* 150 and B/L 152, couple to the voltage sense amplifier. One bit line B/L* 150 is coupled to metal shunt 162 of inverter 103 and to gate 161 of inverter 104. The metal shunt 162 of inverter 103 serves as the output for inverter 103. Bit line B/L 152 couples to metal shunt 163 of inverter 104 and to gate 160 of inverter 103, wherein metal shunt 163 serves as the output for inverter 104. The source/emitter regions 106 of transistors $Q_2$ and $Q_4$ are coupled to ground and the source/emitter regions 108 of transistors $Q_1$ and $Q_3$ are coupled to power supply $V_{dd}$.

FIG. 1B is a top view of the embodiment of FIG. 1A. FIG. 1B illustrates the outputs and gates of inverters 104 and 103 cross-coupled together through bit lines, B/L* 150 and B/L 152 respectively.

Figure 1C:
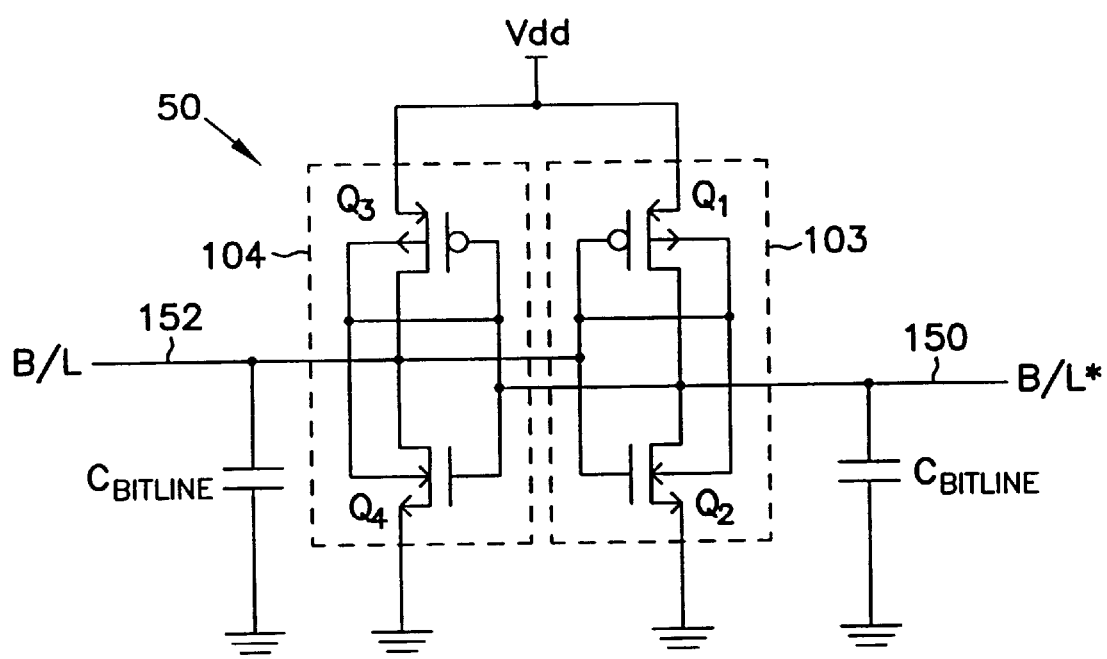
FIG. 1C is a schematic diagram illustrating an embodiment of the voltage sense amplifier of FIG. 1.

FIG. 1C is a schematic diagram of the voltage sense amplifier shown in FIG. 1A. The operation of the embodiment of FIG. 1A is described in connection with the schematic diagram of FIG. 1C. When a conventional memory cell is read, the data contained in that cell is placed on the bit line B/L associated with the cell. Each bit line includes a complementary bit line B/L*. In FIG. 1C, the data cell bit line is illustrated by bit line (B/L) 152 and the complementary bit line is illustrated by bit line (B/L*) 150. In FIG. 1C, voltage sense amplifier 50 comprises four transistors, $Q_1$, $Q_2$, $Q_3$ and $Q_4$ respectively. Transistors $Q_2$ and $Q_4$ are NMOS transistors. Transistors $Q_1$ and $Q_3$ are PMOS transistors.

During a read cycle, the bit lines shown as 150 and 152 are pre-charged to a voltage level of $V_{cc}/2$. When a memory cell is read which stores a logic "1" the voltage on bit line (B/L) 152 is elevated. The increase in potential causes transistor $Q_1$ to turn off and transistor $Q_2$ to turn on. Activation of transistor $Q_2$ pulls the complementary bit line (B/L*) 150 to ground since bit line (B/L*) 150 is coupled to the collector/drain region of transistor $Q_2$. Bit line (B/L*) 150 is additionally cross-coupled to the gates of inverter 104. As bit line (B/L*) 150 is pulled to ground, the decreasing potential activates transistor $Q_3$. Activation of transistor $Q_3$ couples the power supply potential to bit line B/L 152 and pulls B/L 152 up to the power supply voltage level.

Conversely, if the selected memory cell has a logic "0" stored on it, the voltage level on bit line B/L 152 drops. Transistor $Q_1$ turns on coupling bit line B/L* to a high potential level and pulling bit line BL* up to the power supply potential. Additionally, the cross-coupled nature of the gates and outputs places high potential on bit line B/L* 150 at the gates of transistors $Q_3$ and $Q_4$. Transistor $Q_3$ remains off, and transistor $Q_4$ switches on and pulls bit line (B/L) 152 to ground.

Method of Fabrication

Figure 2A:
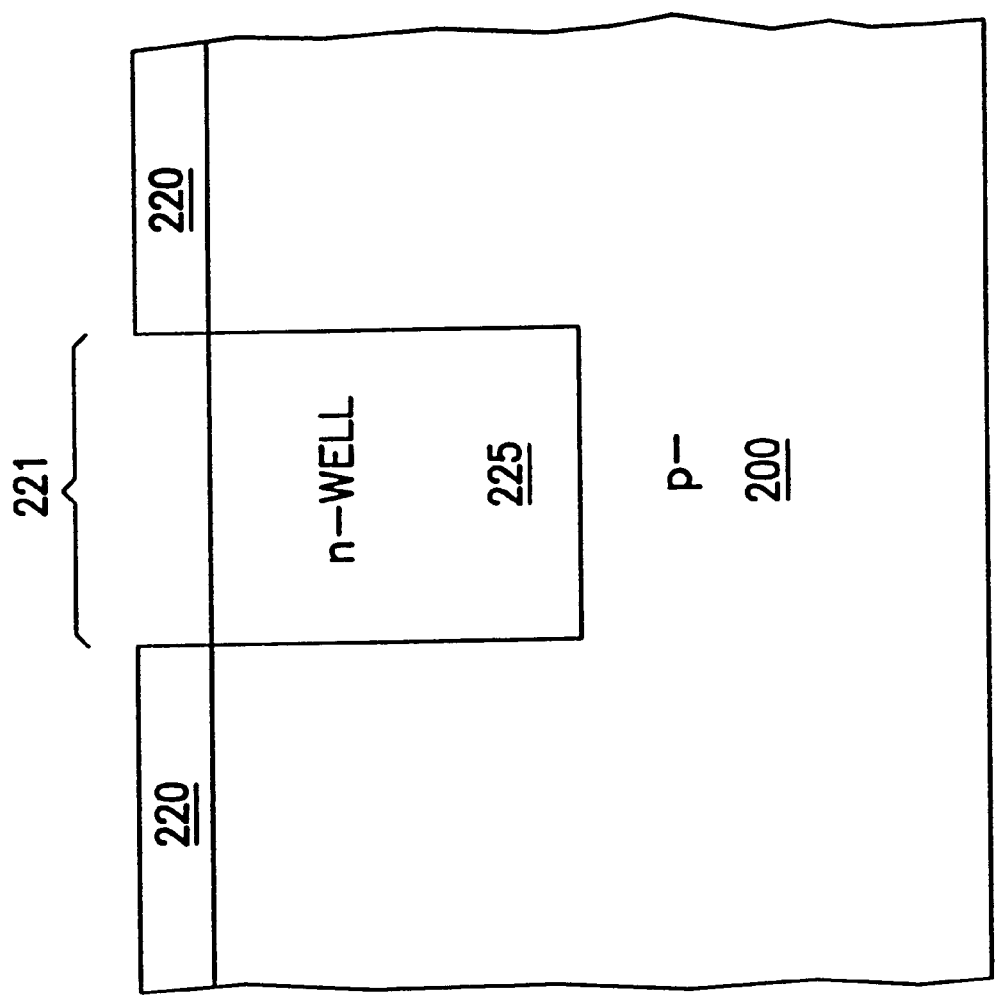

FIGS. 2A through 2J illustrate an embodiment of the various processing steps for fabricating a voltage sense amplifier formed from a complementary pair of gate-body transistors. FIG. 2A begins with a lightly doped p− silicon substrate 200. A thin oxide pad layer is grown and then additional oxide is deposited on the substrate, such as by chemical vapor deposition (CVD), to form oxide layer 220. The oxide layer 220 is formed to a thickness of approximately 0.2 micrometers ($\mu$m). A photoresist is applied and selectively exposed to reveal p-channel metal-oxide semiconductor (PMOS) device region 221. The oxide layer 220 is etched from the PMOS device regions 221, such as by reactive ion etching (RIE). Wells of n-type silicon material are formed in the substrate 200 to form the PMOS device regions 221. The n-wells 225 of n-type material can be formed by any suitable method, such as by ion implantation. The n-wells 225 are formed to a thickness of approximately 0.4 $\mu$m. The photoresist is removed using conventional photoresist stripping techniques. The structure is now as it appears in FIG. 2A.

Figure 2B:
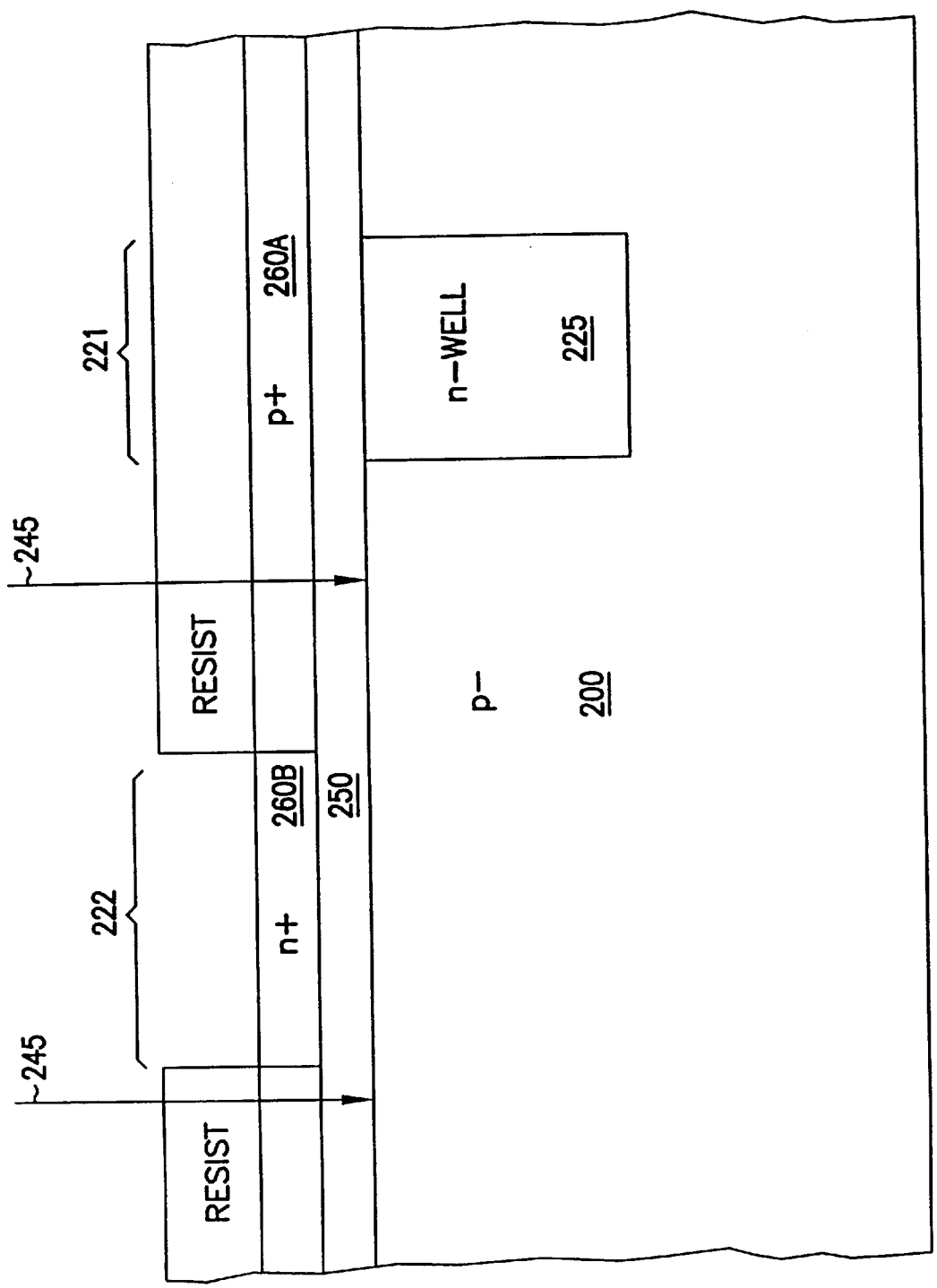

FIG. 2B illustrates the structure after the next sequence of processing steps. The oxide layer 220 is stripped, such as by RIE and a fresh gate oxide 250 is thermally grown on and across the upper surface 245 of the n-well 225 and the p− substrate 200. A p+ polysilicon gate material 260A is deposited across the surface of the oxide layer 250. The p+ layer 260A is formed to a thickness of approximately 0.2 $\mu$m. The p+layer 260A can be deposited through any suitable method, such as through chemical vapor deposition (CVD). A photoresist is applied and selectively exposed to provide a mask-defining an n-channel metal-oxide semiconductor (NMOS) device region 222. An n+ polysilicon gate material 260B is formed in the NMOS device region 222 through a process such as ion implantation of n-type impurity ions. In one embodiment, the n+ dopant is Arsenic (As). The structure is now as appears in FIG. 2B.

Figure 2C:
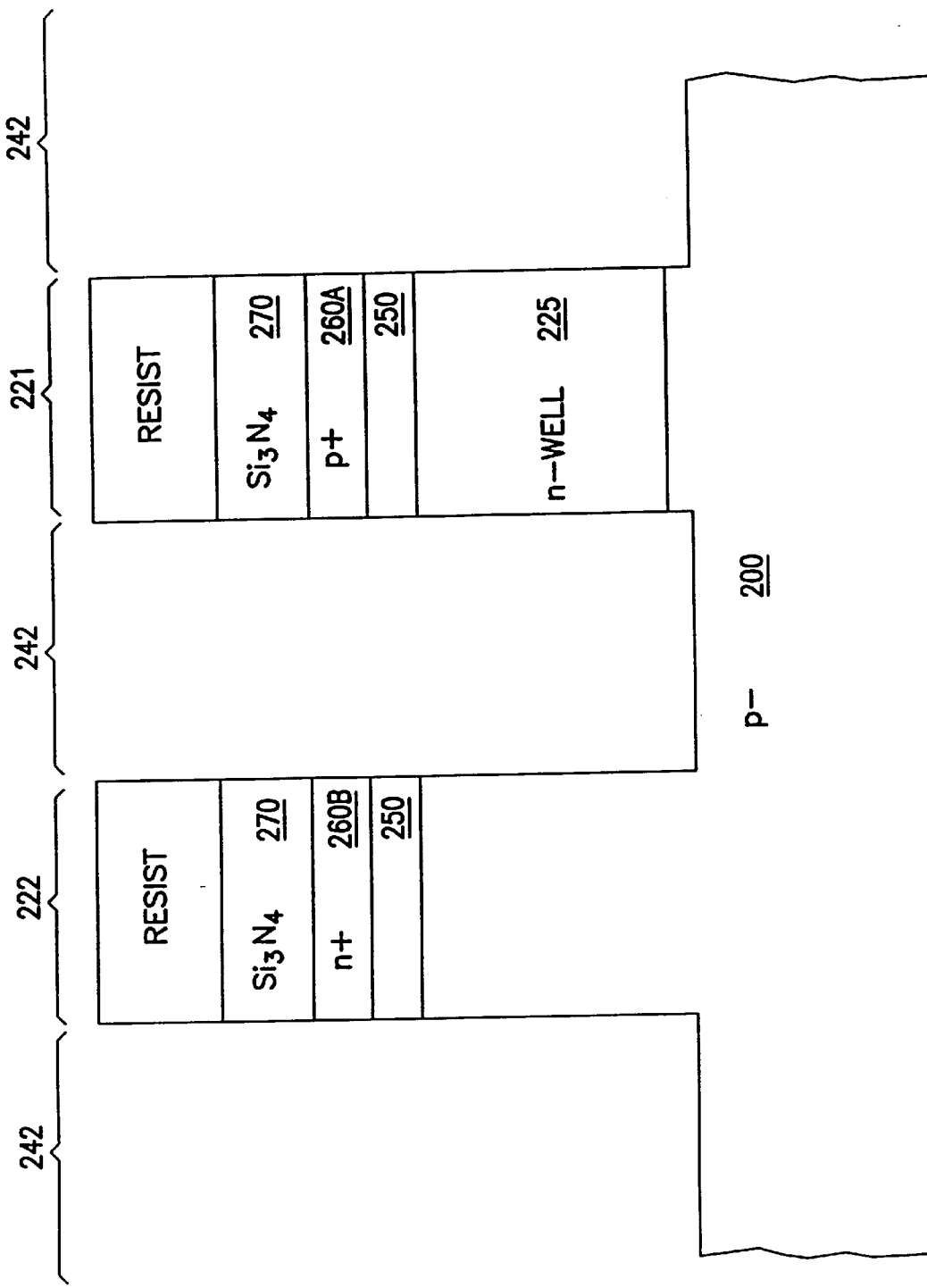

FIG. 2C illustrates the structure after the next sequence of processing steps. The photoresist is stripped, using conventional photoresist stripping techniques. A nitride pad 270 is formed on and across the surface of the n+ gate material 260B and the p+ gate material 260A. The nitride pad 270 is deposited by any suitable process, such as chemical vapor deposition (CVD). The nitride pad is deposited to a thickness of approximately 0.4 $\mu$m. A photoresist is applied and selectively exposed to provide a mask which defines and covers the PMOS and NMOS device regions, 221 and 222 respectively. The nitride cap 270 in between device regions, 221 and 222, is removed. The nitride cap 270 is removed by any suitable etching technique, such as by RIE. The p+ gate material 260A in between device regions, 221 and 222, is removed. And, the gate oxide 250 in between device regions, 221 and 222, is removed. Each of these materials can be removed by etching using the RIE technique.

Still using the photoresist as a mask, the etching process is continued into the p− substrate 200 to a depth of approximately 0.2 $\mu$m below the bottom of the n-well 225/substrate 200 interface. The etching is performed through any suitable process, such as by RIE. These etching steps leave trenches 242 between the device regions 221 and 222. The structure is now as shown in FIG. 2C. The photoresist is next stripped, using conventional photoresist stripping techniques.

Figure 2D:
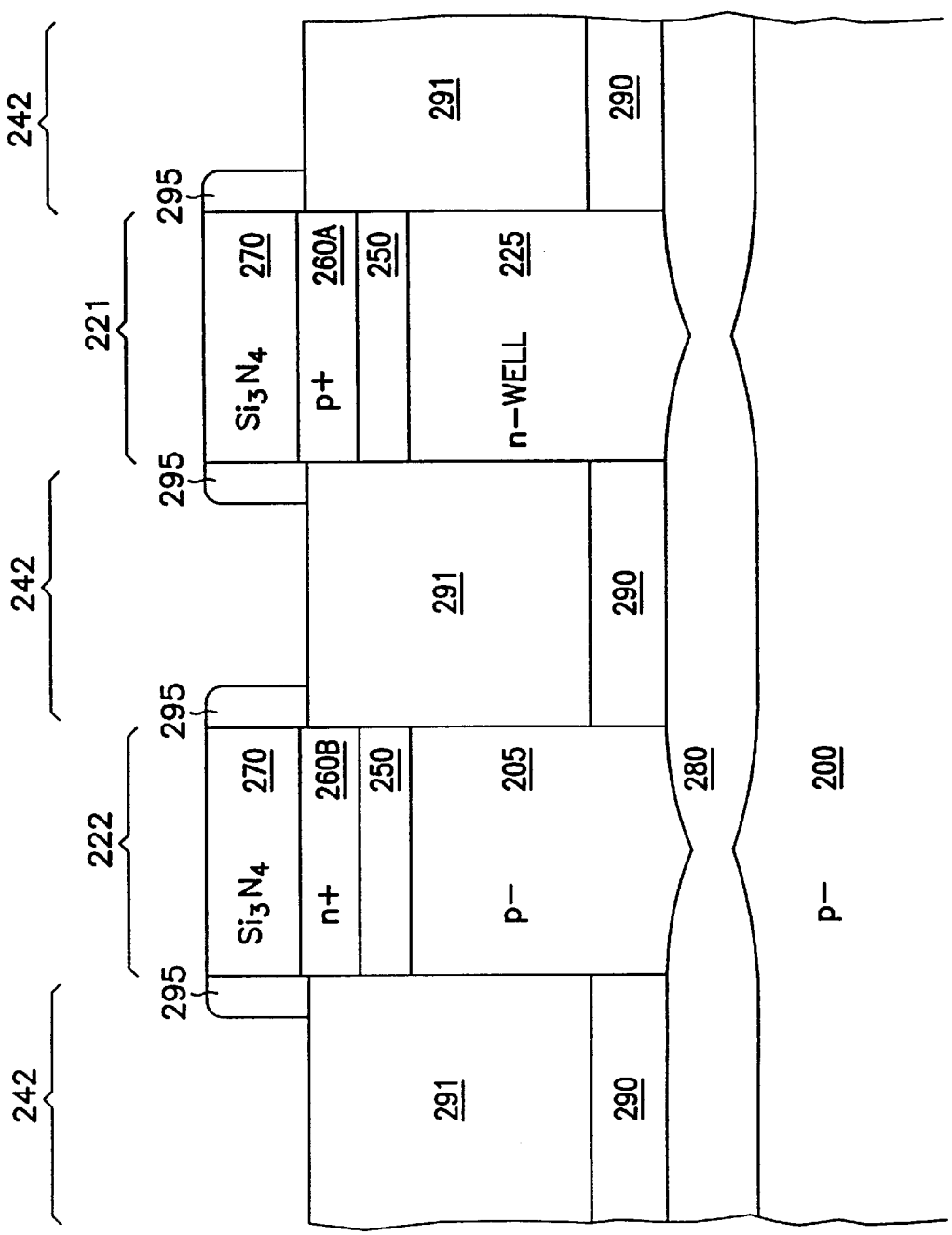

FIG. 2D illustrates the structure after the next series of processing steps. An insulator layer 280 is formed beneath the device regions, 221 and 222 respectively so as to form a semiconductor on insulator (SOI) structure. The insulator layer 280 is formed using, for example, the techniques of U.S. application Ser. No. 08/745,708, entitled Silicon-On-Insulator Islands and Method for Their Formation (the '708 Application), or U.S. Pat. No. 5,691,230, entitled Technique for Producing Small Islands of Silicon on Insulator (the '230 Patent). The '708 Application and the '230 Patent are incorporated by reference. The insulator layer 280 separates the p– single crystalline silicon structure 205 of the NMOS device region 222, and the n-well 225 single crystalline silicon structure of the PMOS device region 221 from the substrate 200.

Next, intrinsic polysilicon 290 is deposited by any suitable methods, such as by CVD, to fill the trenches 242. The trenches 242 are planarized stopping on the nitride pads 270. The intrinsic polysilicon 290 in trenches 242 can be planarized by any suitable process, such as by chemical mechanical polishing/planarization (CMP). The intrinsic polysilicon 290 is directionally etched back to leave approximately 0.1–0.2 μm on the bottom of the trenches 242. The etch can be performed using any suitable method such as reactive ion etching (RIE). Oxide 291 is deposited such as by CVD to fill trenches 242. The oxide 291 is etched back approximately 0.4 μm to the level of the top of the gates 260. A nitride spacer 295 is deposited such as by CVD. The nitride spacer 295 is directionally etched to leave on the exposed vertical sidewalls of the nitride pad 270. The structure is now as shown in FIG. 2D.

Figure 2E:
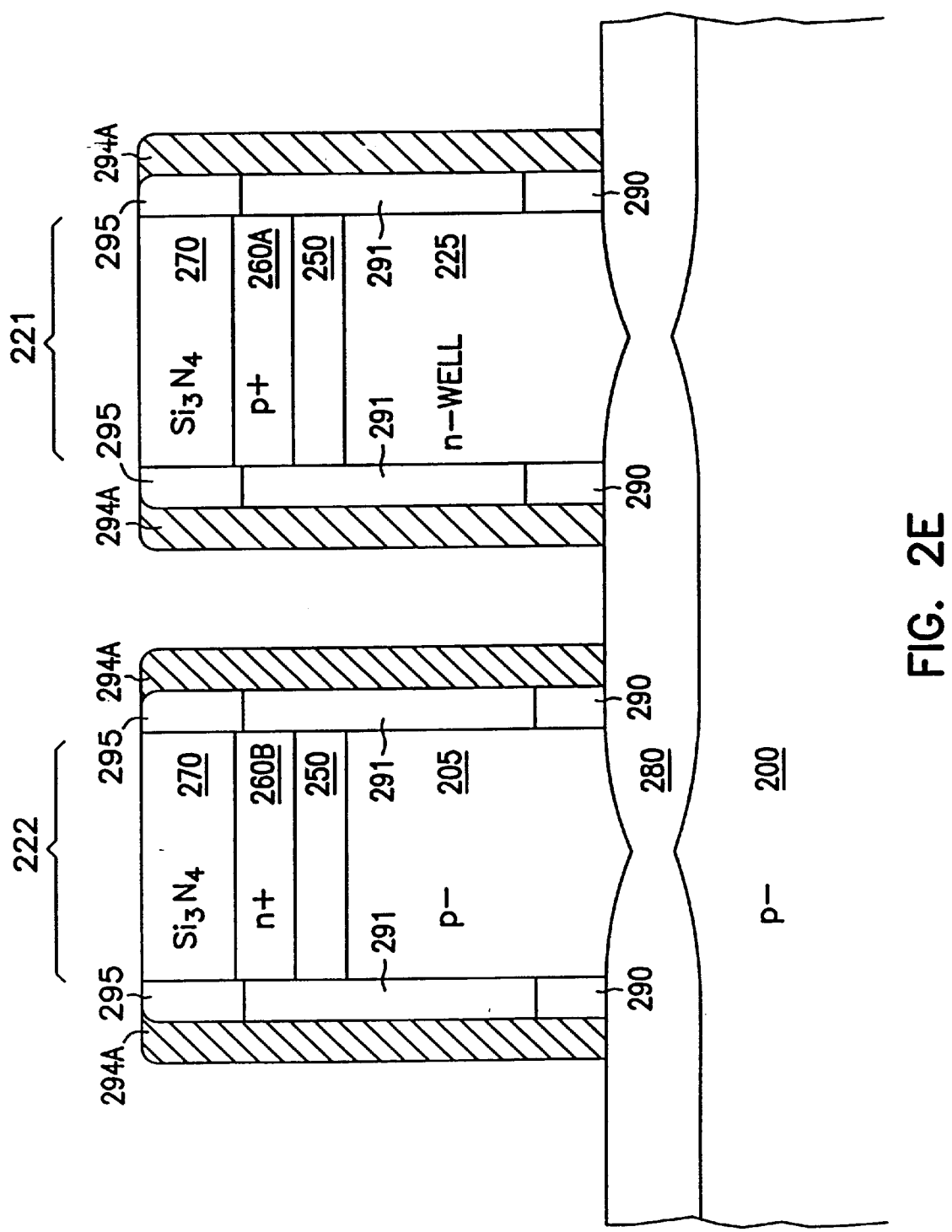

FIG. 2E illustrates the structure following the next sequence of process steps. The oxide 291 and the intrinsic polysilicon 290 are directionally etched using the nitride spacer 295 overhang as a mask. An n+ polysilicon layer 294A is deposited by CVD. The n+ polysilicon 294A is etched, such as by reactive ion etching, to leave on the vertical sidewalls of the oxide spacer 291. The n+ polysilicon layer 294A serves as the conductive sidewall members for the PMOS device region 221. The structure is now as shown in FIG. 2E.

Figure 2F:
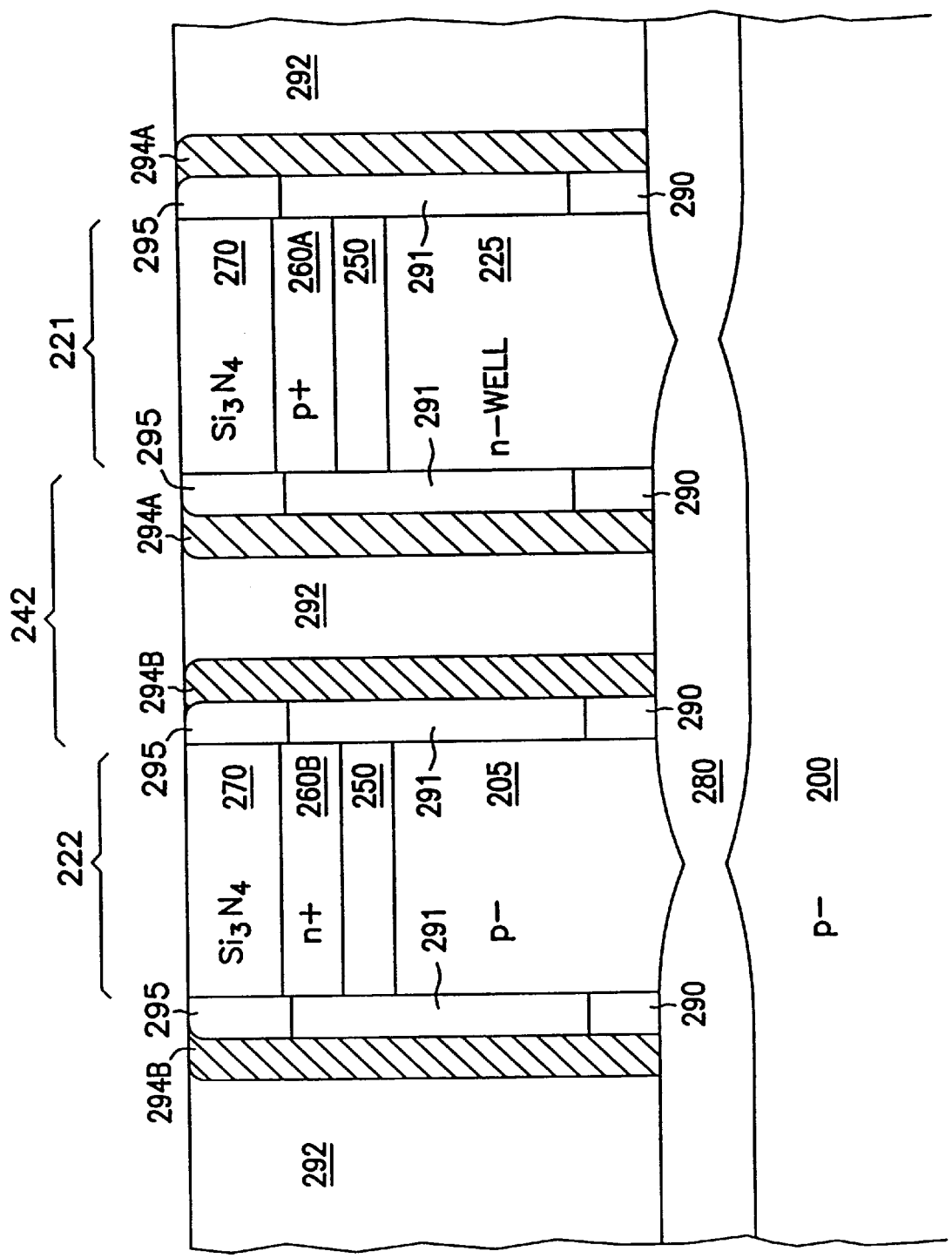

FIG. 2F illustrates the structure after the next sequence of process steps. Silicon dioxide 292 is deposited in the trenches 242 and then planarized using CMP. The silicon dioxide 292 may be deposited by any suitable method, such as by CVD. A photoresist is applied and selectively exposed to reveal only the NMOS device regions 222. The exposed n+ polysilicon 294A is selectively etched to remove from the sidewalls of the NMOS device regions 222. A p+ polysilicon layer 294B is then deposited by CVD to fill the slots left from removal of the n+ polysilicon 294A and is then removed from the top surface of the structures by any suitable method, such as RIE or CMP. The p+ polysilicon layer 294B serves as the conductive sidewall members for the NMOS device region 222. The structure is now as shown in FIG. 2F.

Figure 2G:
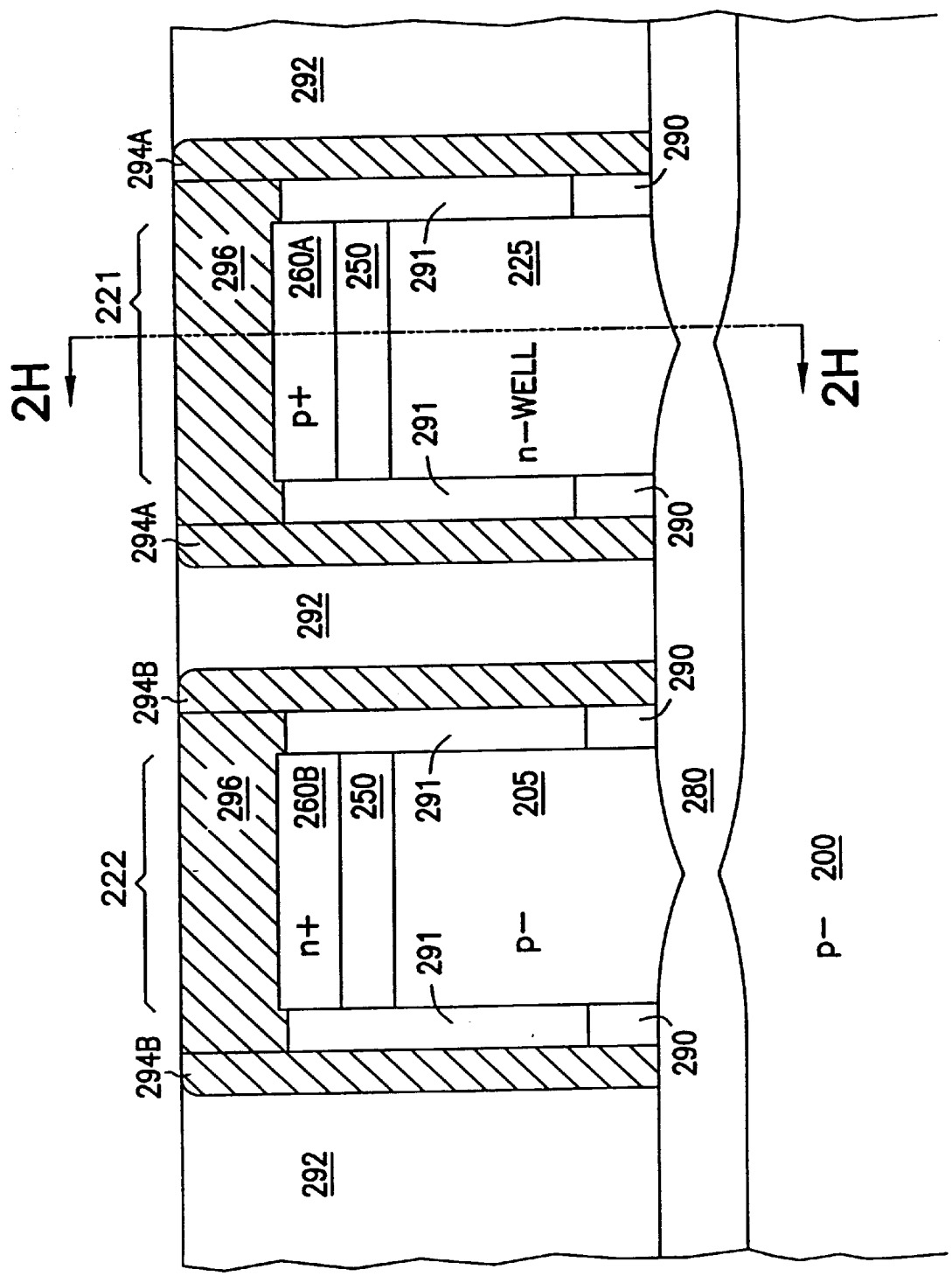

FIG. 2G illustrates the structure following the next sequence of process steps. A phosphoric acid is applied to remove the nitride cap 270 and the nitride spacers 295 from the active device regions, 221 and 222 respectively. Removal of the nitride cap 270 and the nitride spacers 295 exposes the p+ and n+ gate material, 260A and 260B respectively. A gate contact 296 is deposited, such as by CVD, over the p+ and n+ gate regions, 260A and 260B respectively. In one embodiment, the gate contact 296 is formed of tungsten (W). In another embodiment, the gate contact 296 is any other suitable refractory metal. The gate contact 296 is planarized, such as by CMP, such that the gate contact 296 is left only over the p+ and n+ gate regions, 260A and 260B respectively. The device is now as shown in FIG. 2G.

Figure 2H:
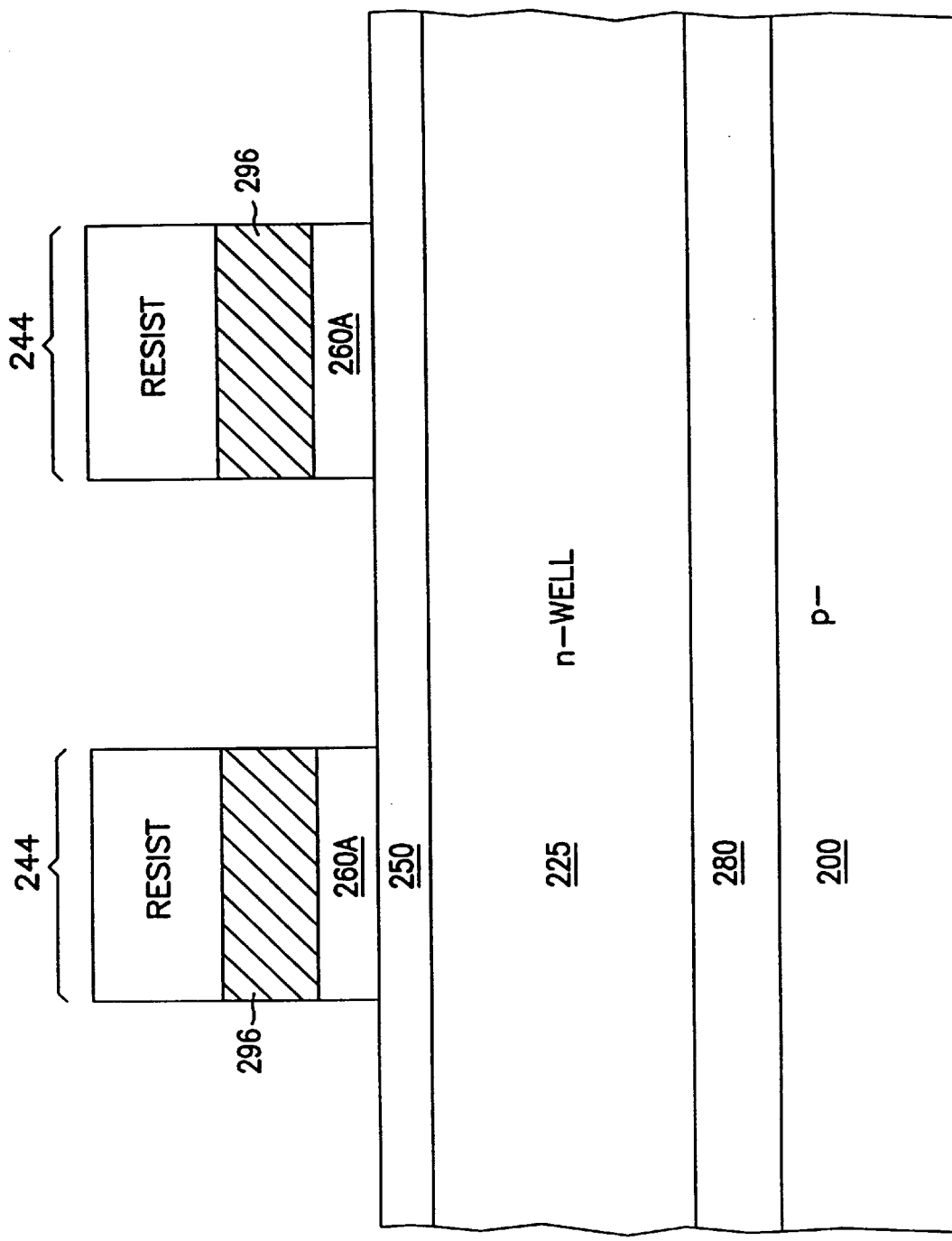
Figure 21:
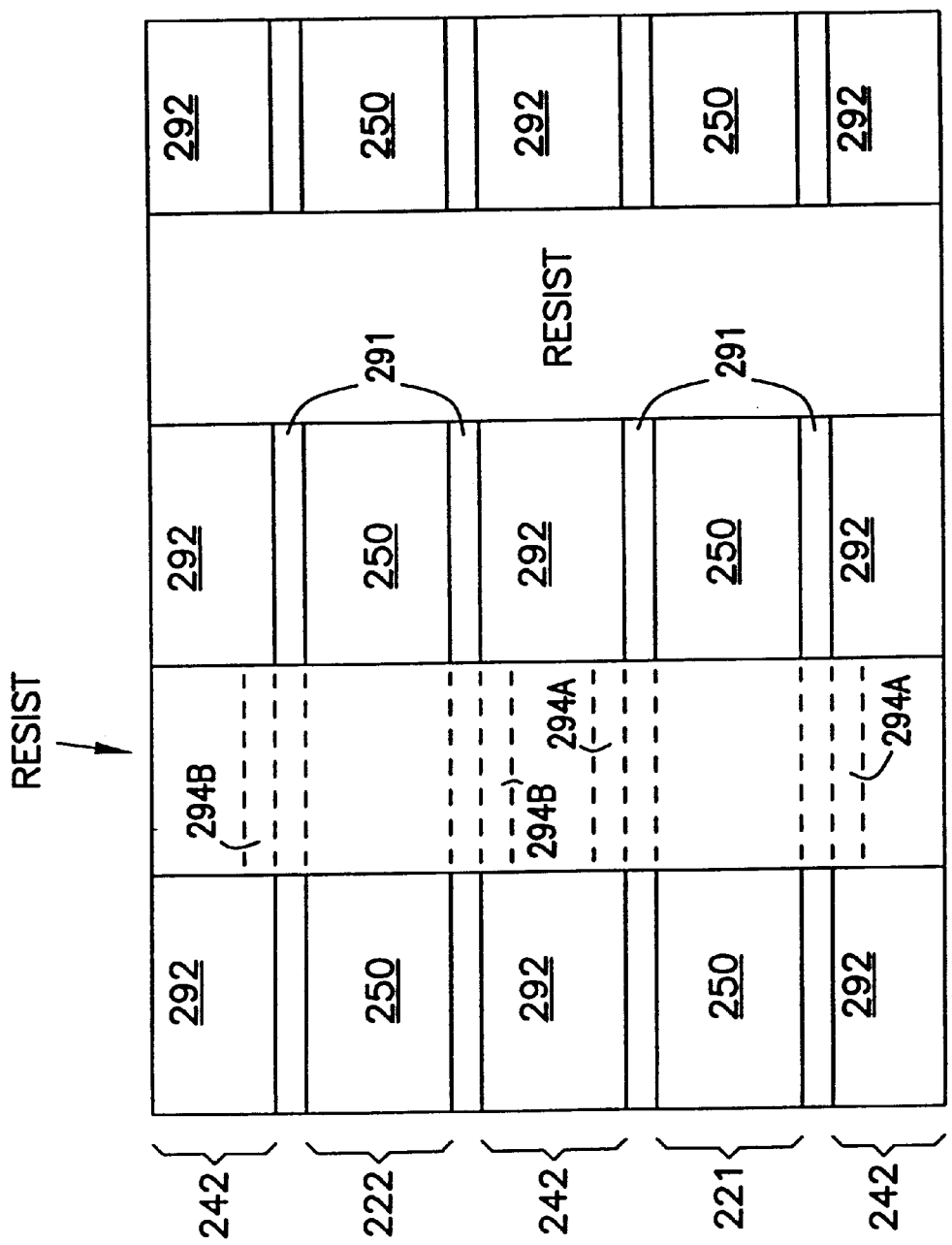

FIG. 2H is a cross sectional view along cut line 2H—2H of FIG. 2G. FIG. 2H illustrates the structure after the following sequence of process steps. A photoresist is applied and selectively exposed to mask the gate regions 244. The gate contact 296 material and the n+ or p+ polysilicon gate material, 260B and 260A, which remain exposed are etched to the underlying gate oxide 250 and insulator layer 280. The etching may be performed using RIE. The structure is now as is shown in FIG. 2H.

FIG. 2I is a top view of FIG. 2H. Using the same mask, the p+ or n+ polysilicon layers 294B and 294A, located between the device regions 221 and 222, are removed by etching. The etching can be performed using any suitable method, such as RIE.

Figure 2J:
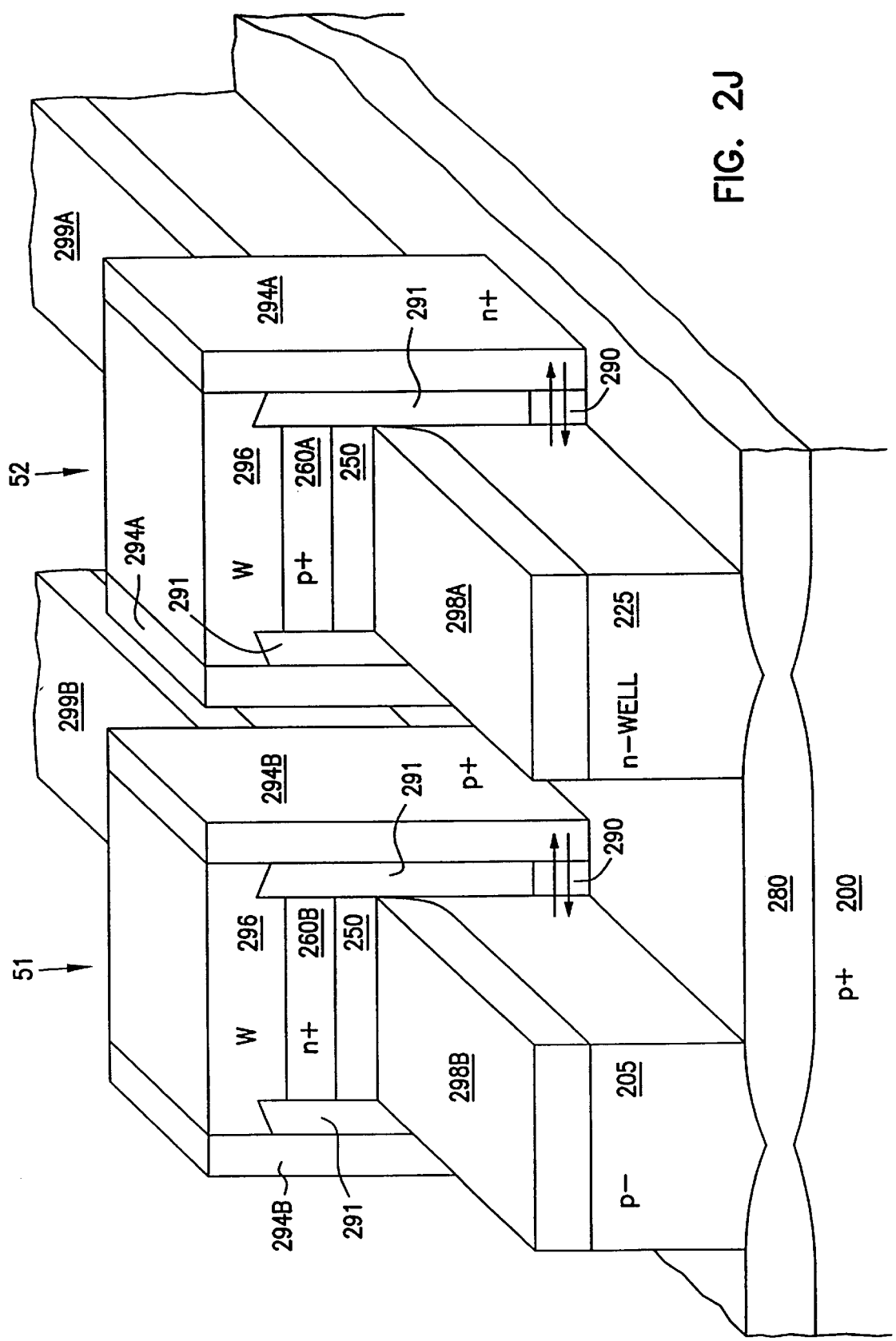

FIG. 2J illustrates the structure following the next series of process steps. The photoresist is removed using conventional photoresist stripping techniques. An anneal is performed to out diffuse Boron (B) from the p– layer 205 and to out diffuse Arsenic (As) from the n-well 225. The anneal also serves to out diffuse the dopants from the p+ and n+ polysilicon layers, 294B and 294A respectively. Hence, the annealing serves to dope the adjoining sandwiched intrinsic polysilicon 290. Boron and Arsenic, respectively, will out diffuse into the intrinsic polysilicon 290 in approximately equal amounts. This process step effectively enhances the thickness of the p+ and n+ polysilicon conductive sidewall members, 294B and 294A respectively.

A photoresist is applied and exposed to cover the NMOS gate-body transistor 51. Then, a p+ source region 298A and a drain region 299A are ion implanted using self-aligning process techniques with the gate 260A. The photoresist is then stripped using conventional photoresist stripping techniques.

Another photoresist is applied and exposed, this time to cover the PMOS gate-body transistor 52. Another ion implantation step is used to form an n+ source region 298B and a drain region 299B in the NMOS gate-body transistor 52. The photoresist is once again removed. The structure is now as shown in FIG. 2J.

The remaining contact holes and wiring required to form the voltage sense amplifier 50 are achieved through conventional metallization processing steps. These steps are recited here in reference to FIG. 1A and FIG. 2J. The NMOS and PMOS transistors, 51 and 52 respectfully, form an inverter equivalent to the embodiment of inverter 104 or inverter 103 as shown in FIG. 1A. Accordingly, the NMOS transistor 51 interchangeably represents transistors $Q_2$ or $Q_4$ shown in FIG. 1A. The PMOS transistor 52 equally represents transistors $Q_1$ and $Q_3$ shown in FIG. 1A. To complete the voltage sense amplifier 50, metal shunt 162 is formed, through standard metallization processing, to connect drain regions, 107 and 109 in FIG. 1A or 299A and 299B of FIG. 2J. Gate contact 160 is formed to couple the gates of NMOS and PMOS transistors, 51 and 52 in FIG. 2J or $Q_2$ and $Q_1$ of FIG. 1A. Gate contact 160 is cross-coupled to a similar metal shunt 163 on the drain regions of inverter 104. A gate contact 161, formed to couple the gates of NMOS and PMOS transistors $Q_3$ and $Q_4$, is cross-coupled to metal shunt 162. The cross-coupled gate contacts and metal shunts, 160, 163, 161 and 162 respectively, include contacts to bit lines B/L* 150 and B/L 152 via conventional processing techniques. The inputs or source regions, 106/298B, of the NMOS transistors, $Q_2$ or $Q_4$ respectively are coupled to ground. One skilled in the art will recognize the method to these steps, and hence they are not disclosed as part of this application. Similarly, a supply potential is coupled to both inputs or source regions, 108/298A, of the PMOS transistors, $Q_1$ and $Q_3$ respectively. This conventional metallization process is not recited here.

Figure 3:
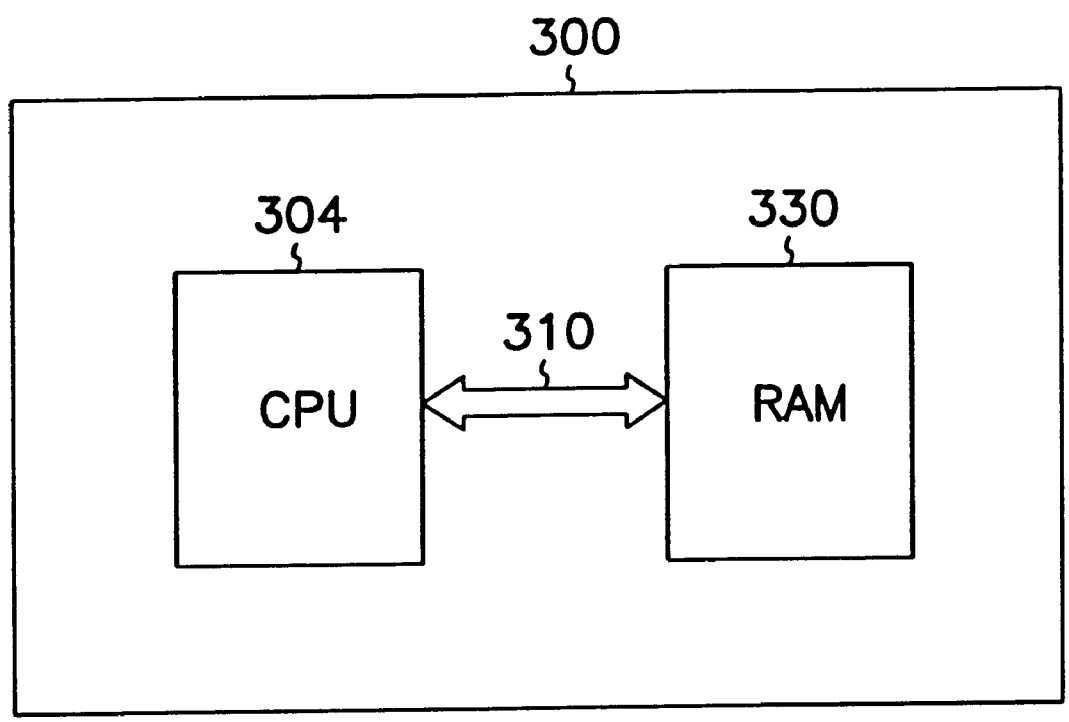
FIG. 3 is a block diagram illustrating an information handling system according to an embodiment of the present invention.

FIG. 3 is a block diagram illustrating an information handling system 300 according to an embodiment of the present invention. The information handling system includes a central processing unit (CPU) 304. The central processing unit 304 is coupled to a memory unit 330 by a system bus 310. By way of illustration and not by way of limitation, the memory unit 330 is a random access memory (RAM). The central processing unit can be constructed to include the voltage sense amplifier structure embodiment presented above.

Conclusion

An improved circuit and method for gate-body transistors is provided. Embodiments of the present invention capitalize on opposing sidewalls and adjacent conductive sidewall members to conserve available surface space on the semiconductor chips. Conservation of surface space achieves a higher density of surface structures per chip. The structures offer performance advantages from both metal-oxide semiconductor (MOS) and bipolar junction transistor (BJT) designs. The devices can be used in a variety of applications, digital and analog, wherever a more compact structure with low power consumption and fast response time is needed.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of fabricating a voltage sense amplifier, the method comprising:
    forming a pair of cross coupled inverters, wherein forming each inverter comprises forming a complementary pair of gate-body transistors, the complementary pair comprising a first channel type transistor and a second channel type transistor, and wherein forming each gate-body transistor comprises:
        forming a body region formed of single crystalline semiconductor material and extending outwardly from a substrate, the body region having an upper surface and opposing sidewalls;
        forming a source region within a portion of the upper surface of the body region;
        forming a drain region within a portion of the upper surface of the body region;
        forming a gate above the upper surface of the body region; and
        forming conductive sidewall members disposed adjacent to the opposing sidewalls of the body region;
    coupling a pair of bit lines, such that each bit line couples to the gates of one of the complementary pair of transistors and to the drain regions of the other complementary pair of transistors.

2. The method of fabricating a voltage sense amplifier of claim 1, wherein forming the body region of each transistor includes forming the body region on an insulator layer formed on the substrate.

3. The method of fabricating a voltage sense amplifier of claim 1, wherein forming the complementary pair of gate-body connected transistors comprises forming an n-channel metal-oxide semiconductor (NMOS) transistor as the first channel type transistor, and forming a p-channel metal-oxide semiconductor (PMOS) transistor as the second channel type transistor.

4. The method of fabricating a voltage sense amplifier of claim 1, wherein the method further comprises forming a dielectric layer between the upper surface of the body region and the gate, and forming a dielectric layer between the opposing sidewalls of the body region and the conductive sidewall members.

5. The method of fabricating a voltage sense amplifier of claim 1, wherein forming the conductive sidewall members comprises coupling the conductive sidewall members to the gate, and coupling the conductive sidewall members couple to a portion of the opposing sidewalls.

6. The method of fabricating a voltage sense amplifier of claim 1, wherein forming the conductive sidewall members comprises forming sidewall members using polysilicon.

7. A method of fabricating a voltage sense amplifier, the method comprising:
    forming a pair of cross coupled inverters, wherein forming each inverter comprises forming a complementary pair of gate-body transistors, the complementary pair comprising a first channel type transistor and a second channel type transistor, and wherein forming each gate-body transistor comprises:
        forming a body region formed of single crystalline semiconductor material and extending outwardly from a substrate, the body region having an upper surface and opposing sidewalls;
        forming a source region within a portion of the upper surface of the body region;
        forming a drain region within a portion of the upper surface of the body region;
        forming a gate above the upper surface of the body region; and
        forming conductive sidewall members disposed adjacent to the opposing sidewalls of the body region, wherein forming the conductive sidewall members comprises coupling the conductive sidewall members to the gate, and coupling the conductive sidewall members to a portion of the opposing sidewalls; and
    coupling a pair of bit lines, such that each bit line couples to the gates of one of the complementary pair of transistors and to the drain regions of the other complementary pair of transistors.

8. The method of fabricating a voltage sense amplifier of claim 7, wherein forming the body region of each transistor includes forming the body region on an insulator layer formed on the substrate.

9. The method of fabricating a voltage sense amplifier of claim 7, wherein forming the complementary pair of gate-body connected transistors comprises forming an n-channel metal-oxide semiconductor (NMOS) transistor as the first channel type transistor, and forming a p-channel metal-oxide semiconductor (PMOS) transistor as the second channel type transistor.

10. The method of fabricating a voltage sense amplifier of claim 7, wherein the method further comprises forming a dielectric layer between the upper surface of the body region and the gate, and forming a dielectric layer between the opposing sidewalls of the body region and a portion of the conductive sidewall members.

11. The method of fabricating a voltage sense amplifier of claim 7, wherein forming the conductive sidewall members comprises forming sidewall members using polysilicon.

12. A method for forming a memory circuit, comprising:
   forming a memory cell array including a number of memory cells;
   forming at least one sense amplifier coupled to the array of memory cells, wherein the at least one sense amplifier includes fabricating a voltage sense amplifier, comprising:
      forming a pair of cross coupled inverters, wherein forming each inverter comprises forming a complementary pair of gate-body transistors, the complementary pair comprising a first channel type transistor and a second channel type transistor, and wherein forming each gate-body transistor comprises:
         forming a body region formed of single crystalline semiconductor material and extending outwardly from a substrate, the body region having an upper surface and opposing sidewalls;
         forming a source region within a portion of the upper surface of the body region;
         forming a drain region within a portion of the upper surface of the body region;
         forming a gate above the upper surface of the body region; and
         forming conductive sidewall members disposed adjacent to the opposing sidewalls of the body region, wherein forming the conductive sidewall members comprises coupling the conductive sidewall members to the gate, and coupling the conductive sidewall members to a portion of the opposing sidewalls; and
      coupling a pair of bit lines, such that each bit line couples to the gates of one of the complementary pair of transistors, to the drain regions of the other complementary pair of transistors, and to the number of memory cells in the memory array.

13. The method of claim 12, wherein forming the body region of each transistor includes forming the body region on an insulator layer formed on the substrate.

14. The method of claim 12, wherein forming the complementary pair of gate-body connected transistors comprises forming an n-channel metal-oxide semiconductor (NMOS) transistor as the first channel type transistor, and forming a p-channel metal-oxide semiconductor (PMOS) transistor as the second channel type transistor.

15. The method of claim 12, wherein the method further comprises forming a dielectric layer between the upper surface of the body region and the gate, and forming a dielectric layer between the opposing sidewalls of the body region and a portion of the conductive sidewall members.

16. The method of claim 12, wherein forming the conductive sidewall members comprises forming sidewall members using polysilicon.

17. A method of forming an information handling system, comprising:
   forming a memory circuit, wherein forming a memory circuit includes:
      forming a memory cell array including a number of memory cells;
      forming at least one sense amplifier coupled to the array of memory cells, wherein the at least one sense amplifier includes fabricating a voltage sense amplifier, comprising:
         forming a pair of cross coupled inverters, wherein forming each inverter comprises forming a complementary pair of gate-body transistors, the complementary pair comprising a first channel type transistor and a second channel type transistor, and wherein forming each gate-body transistor comprises:
            forming a body region formed of single crystalline semiconductor material and extending outwardly from a substrate, the body region having an upper surface and opposing sidewalls;
            forming a source region within a portion of the upper surface of the body region;
            forming a drain region within a portion of the upper surface of the body region;
            forming a gate above the upper surface of the body region; and
            forming conductive sidewall members disposed adjacent to the opposing sidewalls of the body region, wherein forming the conductive sidewall members comprises coupling the conductive sidewall members to the gate, and coupling the conductive sidewall members to a portion of the opposing sidewalls; and
         coupling a pair of bit lines, such that each bit line couples to the gates of one of the complementary pair of transistors, to the drain regions of the other complementary pair of transistors, and to the number of memory cells in the memory array; and
   coupling a processor unit to the memory circuit using a bus.

18. The method of claim 17, wherein forming the memory circuit and coupling a processor unit to the memory circuit includes coupling a the processor unit to the memory circuit on a single chip.

19. The method of claim 17, wherein forming the body region of each transistor includes forming the body region on an insulator layer formed on the substrate.

20. The method of claim 17, wherein forming the complementary pair of gate-body connected transistors comprises forming an n-channel metal-oxide semiconductor (NMOS) transistor as the first channel type transistor, and forming a p-channel metal-oxide semiconductor (PMOS) transistor as the second channel type transistor.

21. The method of claim 17, wherein the method further comprises forming a dielectric layer between the upper surface of the body region and the gate, and forming a dielectric layer between the opposing sidewalls of the body region and a portion of the conductive sidewall members.

22. The method of claim 17, wherein forming the conductive sidewall members comprises forming sidewall members using polysilicon.

* * * * *

UNITED STATES PATENT AND TRADEMARK OFFICE
CERTIFICATE OF CORRECTION

PATENT NO. : 6,235,569 B1  
DATED : May 22, 2001  
INVENTOR(S) : Wendell P. Noble, Leonard Forbes Page 1 of 1

It is certified that error appears in the above-identified patent and that said Letters Patent is hereby corrected as shown below:

Column 3,
Line 16, "instrmentalities" should read -- instrumentalities --.

Column 12,
Line 43, delete "a" between "coupling" and "the processor".

Signed and Sealed this

Twenty-ninth Day of January, 2002

Attest:

*Attesting Officer*

JAMES E. ROGAN
*Director of the United States Patent and Trademark Office*